(12) United States Patent
He et al.

(10) Patent No.: US 11,478,860 B2
(45) Date of Patent: Oct. 25, 2022

(54) COATED TOOL, AND CUTTING TOOL INCLUDING SAME

(71) Applicant: KYOCERA Corporation, Kyoto (JP)

(72) Inventors: Dan He, Satsumasendai (JP); Tsuyoshi Yamasaki, Satsumasendai (JP)

(73) Assignee: KYOCERA CORPORATION, Kyoto (JP)

( * ) Notice: Subject to any disclaimer, the term of this patent is extended or adjusted under 35 U.S.C. 154(b) by 129 days.

(21) Appl. No.: 16/963,865

(22) PCT Filed: Jan. 24, 2019

(86) PCT No.: PCT/JP2019/002312
§ 371 (c)(1),
(2) Date: Dec. 30, 2020

(87) PCT Pub. No.: WO2019/146711
PCT Pub. Date: Aug. 1, 2019

(65) Prior Publication Data
US 2021/0138558 A1 May 13, 2021

(30) Foreign Application Priority Data
Jan. 26, 2018 (JP) .............................. JP2018-011495

(51) Int. Cl.
*B23B 27/14* (2006.01)
*C23C 14/06* (2006.01)
*C23C 14/32* (2006.01)
*C23C 14/34* (2006.01)

(52) U.S. Cl.
CPC ........ *B23B 27/148* (2013.01); *C23C 14/0641* (2013.01); *C23C 14/32* (2013.01); *C23C 14/34* (2013.01); *B23B 2228/10* (2013.01)

(58) Field of Classification Search
CPC ... B23B 27/14; B23B 27/148; B23B 2224/24; B23B 2228/10; C23C 14/0641; C23C 28/42; C23C 28/44; B23C 5/16
USPC ........................................................ 428/697
See application file for complete search history.

(56) References Cited

U.S. PATENT DOCUMENTS

2012/0128971 A1 5/2012 Shibata
2018/0071831 A1 3/2018 Tanaka

FOREIGN PATENT DOCUMENTS

| EP | 2463398 A1 | 6/2012 |
| JP | 10-263903 A | 10/1998 |
| WO | 2011/016488 A1 | 2/2011 |
| WO | 2016/158717 A1 | 10/2016 |

*Primary Examiner* — Archene A Turner
(74) *Attorney, Agent, or Firm* — Volpe Koenig

(57) ABSTRACT

A coated tool according to the present disclosure includes a base member and a coating layer located on the base member. The coating layer includes a first peak located in a range of 15° to 30° and a second peak located in a range of 60° to 75° in a distribution of X-ray intensity indicated at α axis of a pole figure, the X-ray intensity regarding a plane of the cubic crystal. The coating layer includes a valley part between the first peak and the second peak, and the valley part includes the X-ray intensity smaller than the X-ray intensity at each of the first peak and the second peak. The X-ray intensity at the first peak is 0.7 times or greater of the X-ray intensity at the second peak.

7 Claims, 7 Drawing Sheets

Distribution of X-ray intensity of pole figure regarding (200) plane of AlTiN crystal Distribution of X-ray intensity of pole figure regarding (200) plane of AlTiN crystal Distribution of X-ray intensity of pole figure regarding (200) plane of AlTiN crystal Distribution of X-ray intensity of pole figure regarding (200) plane of AlTiN crystal

US 11,478,860 B2

COATED TOOL, AND CUTTING TOOL INCLUDING SAME

TECHNICAL FIELD

The present disclosure relates to a coated tool for use in a cutting process.

BACKGROUND

As a coated tool for use in a cutting process, such as a turning process and a milling process, a coating member for a cutting tool, which is configured to provide a coating film to a base material and described, for example, in Patent Document 1, has been known. The coated tool described in Patent Document 1 includes a tool base member and a hard coating film that is made of metal compound in a cubic shape and coats the tool base member. Then, Patent Document 1 describes that, when the hard coating film made of metal compound has each of a (111) plane and a (200) plane tilted at a predetermined angle to a surface of the tool base member, the coated tool is improved in wear resistance.

RELATED ART DOCUMENTS

Patent Document

Patent Document 1: WO 2011/016488 A

SUMMARY

A coated tool according to the present disclosure includes a base member and a coating layer located on the base member. The coating layer includes a cubic crystal that includes one or more kinds of elements selected from Groups 4, 5 and 6 in the periodic table, Al, Si, B, Y and Mn, and one or more kinds of elements selected from C, N and O. The coating layer includes a first peak located in a range of 15° to 30° and a second peak located in a range of 60° to 75° in a distribution of X-ray intensity indicated at a axis of a pole figure, the X-ray intensity regarding a (200) plane of the cubic crystal. The coating layer includes a valley part between the first peak and the second peak, and the valley part includes the X-ray intensity smaller than the X-ray intensity at each of the first peak and the second peak. The X-ray intensity at the first peak is 0.7 times or greater of the X-ray intensity at the second peak. A cutting tool according to the present disclosure includes a holder which extends from a first end toward a second end and includes a pocket located at a side of the first end, and the coated tool located in the pocket.

EMBODIMENTS

<Coated Tool>

Figure 1:
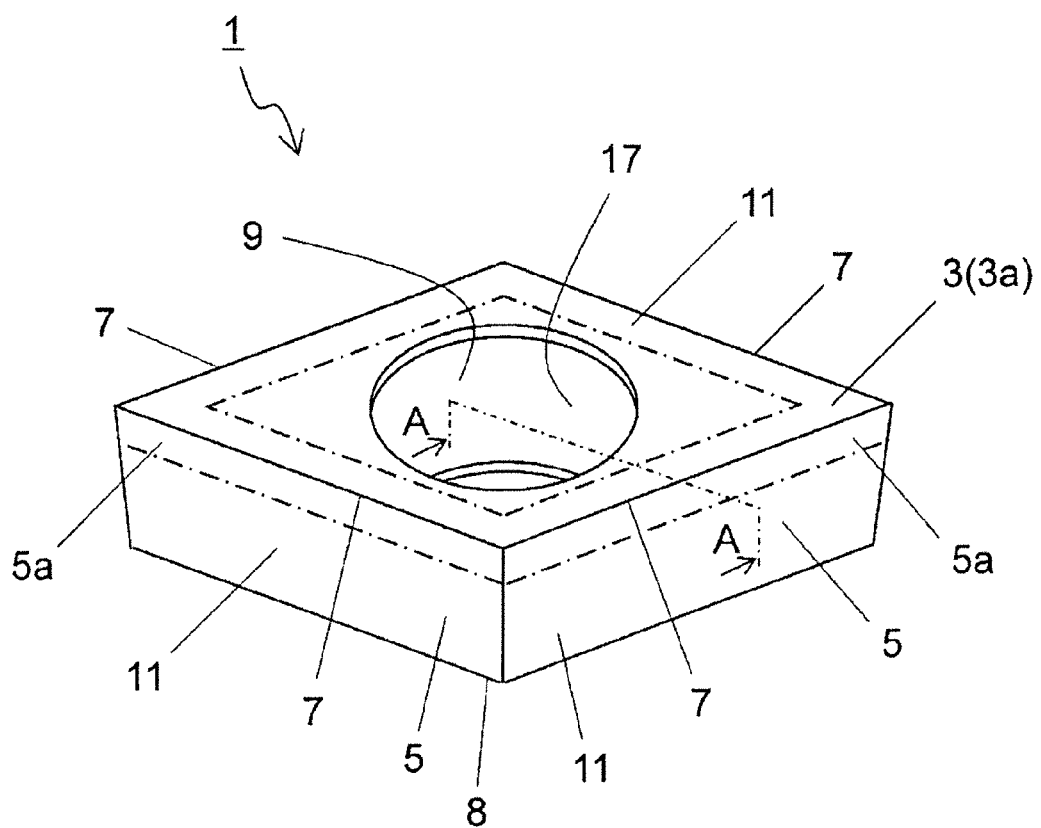
FIG. 1 is a perspective view illustrating an example of a coated tool according to the present disclosure.

A coated tool according to an embodiment of the present disclosure will be described in detail below with reference to the drawings. For the sake of description, the drawings referred to in the following illustrate, in a simplified form, only main members necessary for describing an embodiment. The coated tool according to the present disclosure is therefore capable of including any arbitrary structural member not illustrated in the drawings referred to. Sizes of the members in each of the drawings faithfully represent neither sizes of actual structural members nor size ratios of these members. The same applies to a cutting tool as will be described later.

The coated tool 1 in the embodiment has a quadrangular plate shape and includes a first surface 3 (upper surface in FIG. 1) having a quadrangular shape, a second surface 5 (side surface in FIG. 1), and a cutting edge 7 located on at least a part of a ridge line where the first surface 3 intersects with the second surface 5. The coated tool 1 according to the embodiment further includes a third surface 8 (lower surface in FIG. 1) having the quadrangular shape.

The entirety of an outer periphery of the first surface 3 may correspond to the cutting edge 7 in the coated tool 1 according to the embodiment. However, the coated tool 1 is not limited to the above configuration. For example, the cutting edge 7 may be located on only one side or a part of the first surface 3 having the quadrangular shape.

The first surface 3 at least partially includes a rake surface region 3a. In the first surface 3, the region which is located along the cutting edge 7 may serve as the rake surface region 3a. The second surface 5 at least partially includes a flank surface region 5a. In the second surface 5, the region which is located along the cutting edge 7 may serve as the flank surface region 5a. In other words, with this configuration, the cutting edge 7 may be located on an intersecting part of the rake surface region 3a and the flank surface region 5a.

In FIG. 1, a boundary between the rake surface region 3a and other region on the first surface 3 is indicated by a chain line. Additionally, a boundary between the flank surface region 5a and other region on the second surface 5 is indicated by a chain line. Because FIG. 1 illustrates an example in which all the ridge line where the first surface 3 intersects with the second surface 5 serves as the cutting edge 7, the boundary above on the first surface 3 is indicated by the chain line of a ring shape.

A size of the coated tool 1 is not particularly limited. For example, a length of one side of the first surface 3 is settable to approximately 3-20 mm in the embodiments. A height from the first surface 3 to the third surface 8 located on an opposite side of the first surface 3 may be set to approximately 5-20 mm.

Figure 2:
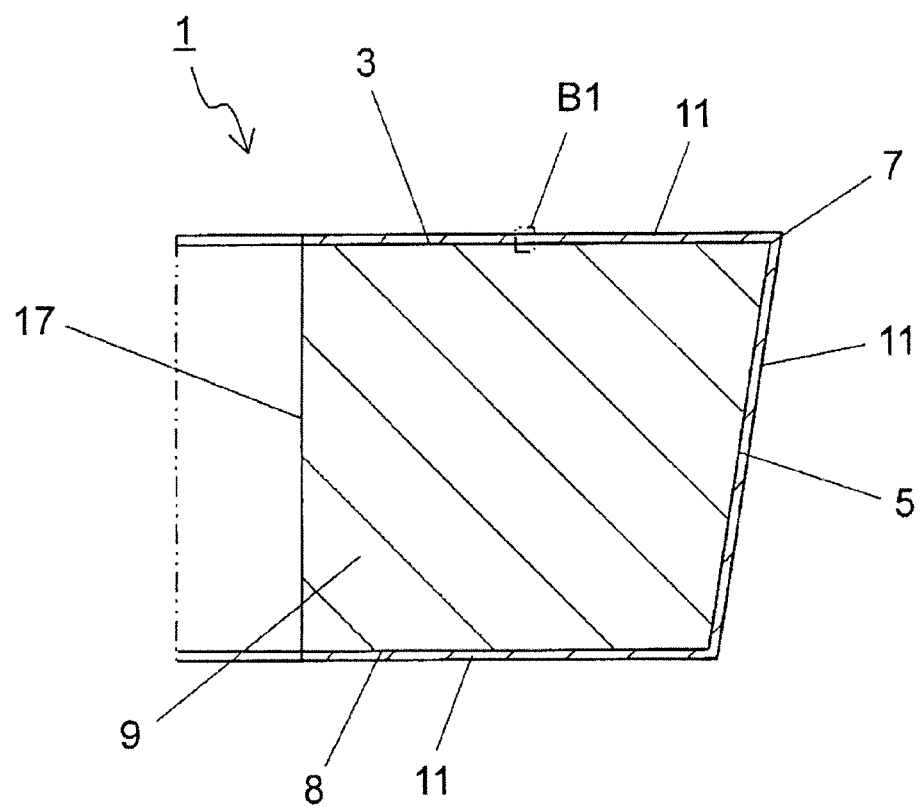
FIG. 2 is a sectional view taken along line A-A in the coated tool illustrated in FIG. 1.

As illustrated in FIG. 1 and FIG. 2, the coated tool 1 according to the present disclosure includes a base member 9 having the quadrangular plate shape and a coating layer 11 that coats a surface of the base member 9. The coating layer 11 may cover the whole or only a part of the surface of the base member 9. If the coating layer 11 covers only the part of the base member 9, it can be said that the coating layer 11 is located on at least the part of the base member 9.

A thickness of the coating layer 11 is settable to, for example, approximately 0.1-10 μm. The thickness of the coating layer 11 may be constant or may be changed depending on location.

Figure 3A:
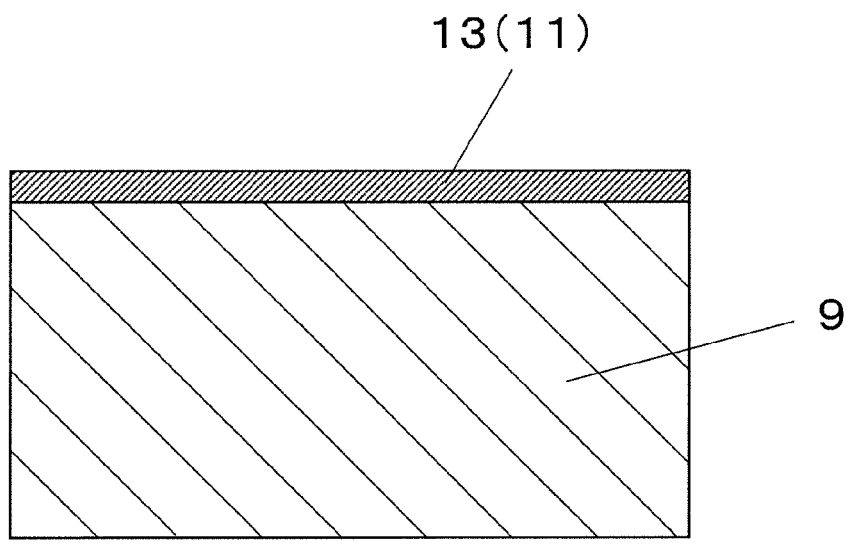
FIG. 3A is an enlarged view of a region B1 illustrated in FIG. 2.

With regard to the coating layer 11, as illustrated in FIG. 3A, the coating layer 11 is located on the surface of the base member 9.

The coating layer 11 includes a cubic crystal that includes one or more kinds of elements selected from Groups 4, 5 and 6 in the periodic table, Al, Si, B, Y and Mn, and one or more kinds of elements selected from C, N and O. The cubic crystal is, for example, AlTiN, AlCrN or TiN. The TiAlN crystal is a crystal where Al is solid-dissolved in the TiN crystal.

Each of these cubic crystals has high hardness and excellent wear resistance, and is preferably used for the coating layer 11 of the coated tool 1.

With the coated tool 1 according to the present disclosure, the cubic crystal in the coating layer 11 is controlled in orientation, so that the coated tool 1 is improved in durability. The cubic crystal in the coating layer 11 includes a (200) plane. In order to evaluate the orientation of the cubic crystal based on the (200) plane of the cubic crystal, an X-ray diffraction device is used to measure an angle of the (200) plane of the cubic crystal in the coating layer 11 tilted to the surface of the base member 9.

Figure 4:
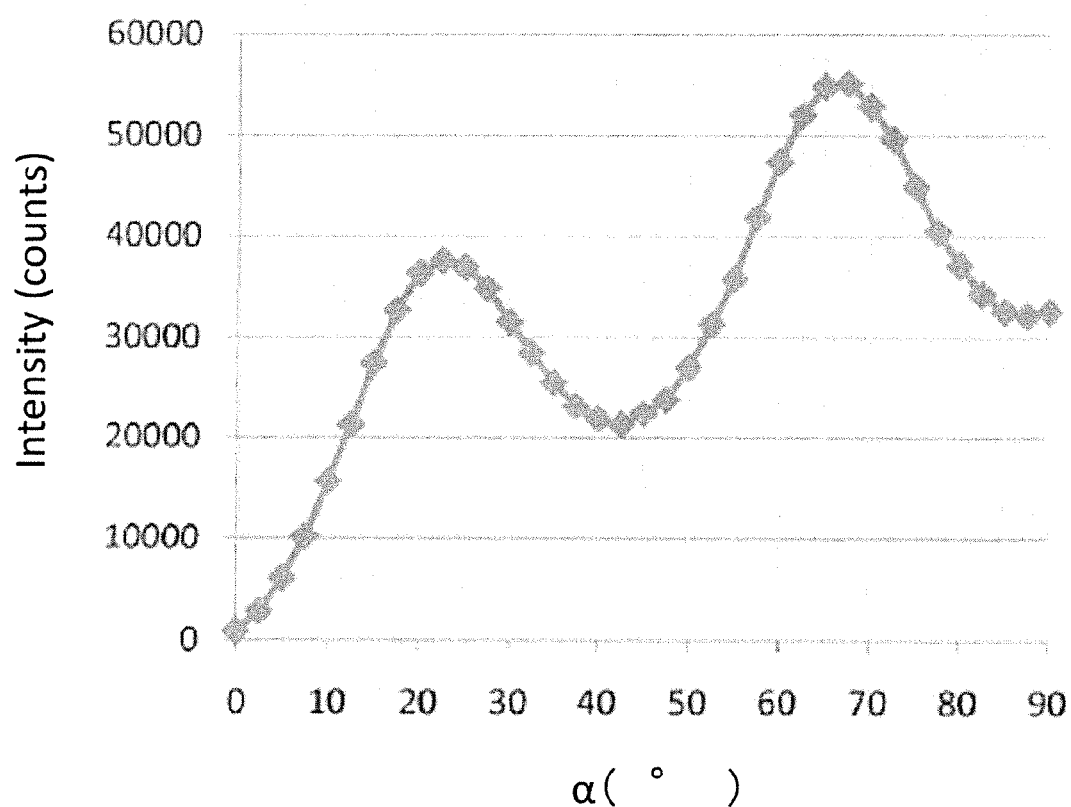
FIG. 4 is an example of a distribution diagram of X-ray intensity indicated on a pole figure, the X-ray intensity regarding a (200) plane of an AlTiN crystal included in an AlTiN layer.
Figure 5:
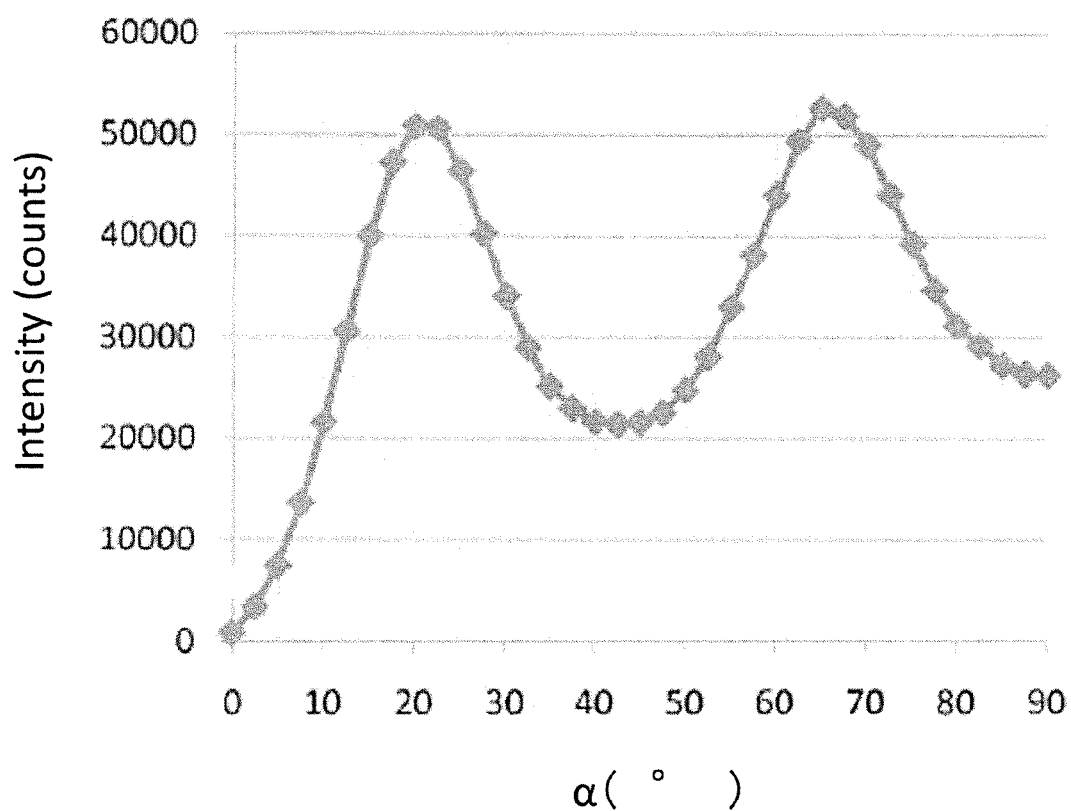
FIG. 5 is an example of the distribution diagram of X-ray intensity indicated on the pole figure, the X-ray intensity regarding the (200) plane of the AlTiN crystal included in the AlTiN layer.
Figure 6:
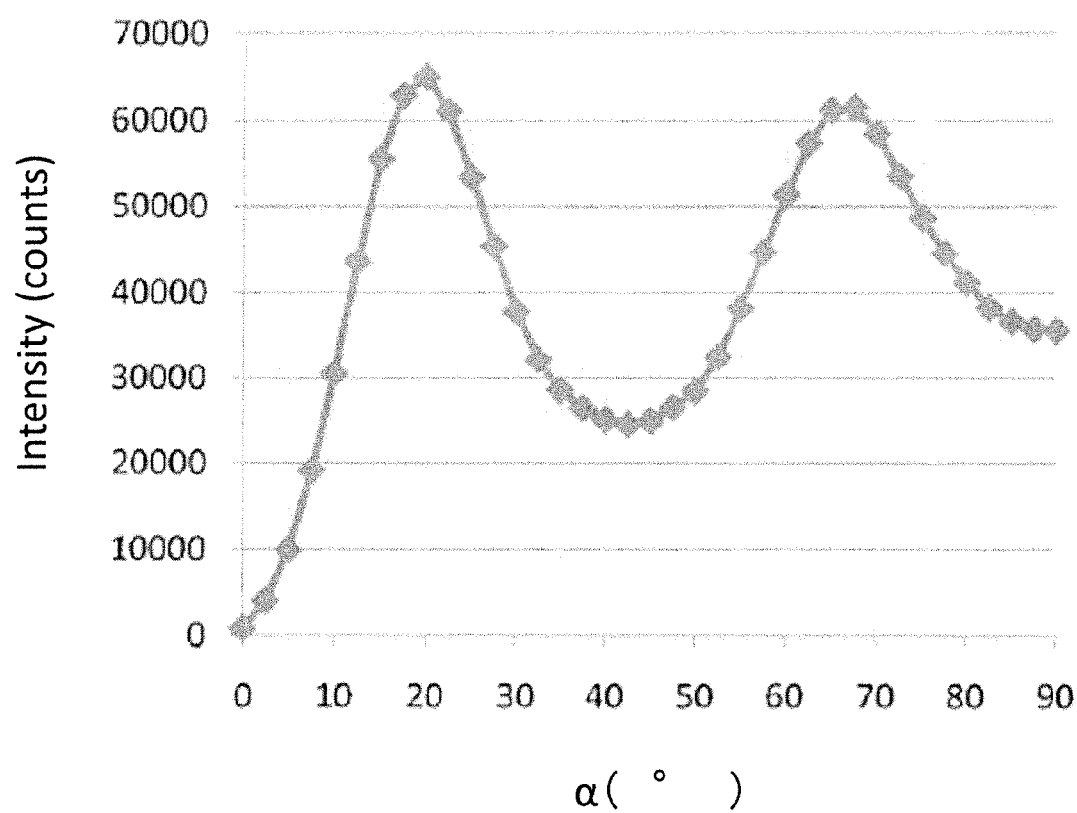
FIG. 6 is an example of the distribution diagram of X-ray intensity indicated on the pole figure, the X-ray intensity regarding the (200) plane of the AlTiN crystal included in the AlTiN layer.

As illustrated in FIGS. 4 to 6, it is possible to evaluate the orientation in the (200) plane of the cubic crystal based on a distribution of X-ray intensity on a pole figure.

For example, if showing a peak at a position of 50° in the distribution of X-ray intensity on the pole figure regarding the (200) plane of the cubic crystal, the cubic crystal including the (200) plane tilted at 50° to the surface of the base member 9 is assumed to be large in quantity.

With the coated tool 1 according to the present disclosure, the coating layer 11 includes a first peak located in a range of 0° to 90° and a second peak located at a higher angle side than the first peak, in the distribution of X-ray intensity indicated at a axis of the pole figure, the X-ray intensity regarding the (200) plane of the cubic crystal. Further, the coating layer 11 includes a valley part between the first peak and the second peak, and the valley part includes the X-ray intensity smaller than the X-ray intensity at each of the first peak and the second peak.

As has been described above, if the coating layer 11 includes a plurality of peaks in the distribution of X-ray intensity indicated at a axis of the pole figure regarding the (200) plane of the cubic crystal, the cubic crystal includes different orientations.

For example, in FIGS. 4 to 6, the first peak is located at approximately 20°, and the second peak is located at approximately 65°. Note that, with regard to a size (large/small) relationship between the first peak and the second peak in the present disclosure, the size is compared based on the X-ray intensity at each peak indicated at a axis in the distribution of X-ray intensity.

In other words, with the coated tool 1 according to the present disclosure, a large number of the cubic crystal including the (200) plane tilted at 20° to the surface of the base member 9 exist, and a large number of the cubic crystal including the (200) plane tilted at 65° to the surface of the base member 9 also exist.

The inventors of the present disclosure have found that, if including the first peak located in a range of 15° to 30°, the coating layer 11 is greater in peeling load. Further, the inventors have found that, if including the second peak located in a range of 60° to 75°, the coating layer 11 is higher in hardness while smaller in peeling load.

With the coated tool 1 according to the present disclosure, in the distribution of X-ray intensity indicated at a axis of the pole figure, the X-ray intensity regarding the (200) plane of the cubic crystal, the coating layer 11 includes the first peak located in a range of 15° to 30° and the second peak located in a range of 60° to 75°. The coating layer 11 further includes the valley part between the first peak and the second peak, and the valley part includes the X-ray intensity smaller than the X-ray intensity at each of the first peak and the second peak. The X-ray intensity at the first peak is 0.7 times or greater of the X-ray intensity at the second peak.

As illustrated in FIGS. 5 and 6, if the coating layer 11 has a configuration where the X-ray intensity at the first peak is 0.7 times or greater of the X-ray intensity at the second peak, the coated tool 1 is greater in peeling load. Concurrently, the coated tool 1 is relatively higher in hardness and is thus well balanced.

The X-ray intensity at the first peak may be 1.0 times or greater of the X-ray intensity at the second peak. As illustrated in FIG. 5, when an AlTiN layer 13 includes a configuration where the X-ray intensity at the second peak is 1.0 times or greater of the X-ray intensity at the first peak, the coated tool 1 is further greater in peeling load.

The coated tool 1 greater in peeling load is excellent in durability, and thus provides a cutting process stably for a long period of time.

On the other hand, as illustrated in FIG. 4, if the X-ray intensity at the first peak is less than 0.7 times of the X-ray intensity at the second peak, the coated tool 1 is smaller in peeling load.

The peeling load can be measured in a scratch test and is an index for evaluating peeling resistance of the coating film 11.

The coating layer 11 may include an AlTiN layer 13 including the AlTiN crystal as the cubic crystal. The AlTiN layer 13 may include a higher content ratio of aluminum than that of titanium. Alternatively, the AlTiN layer 13 may contain a higher content ratio of titanium than that of aluminum. Still alternatively, the AlTiN layer 13 may include chromium in addition to aluminum and titanium. In this case, a total of the content ratios of aluminum and titanium is higher than a content ratio of chromium. The content ratio of chromium included in the AlTiN layer 13 may be set to, for example, 0.1-20%. The term "content ratio" indicates a content ratio in terms of atomic ratio.

Figure 3B:
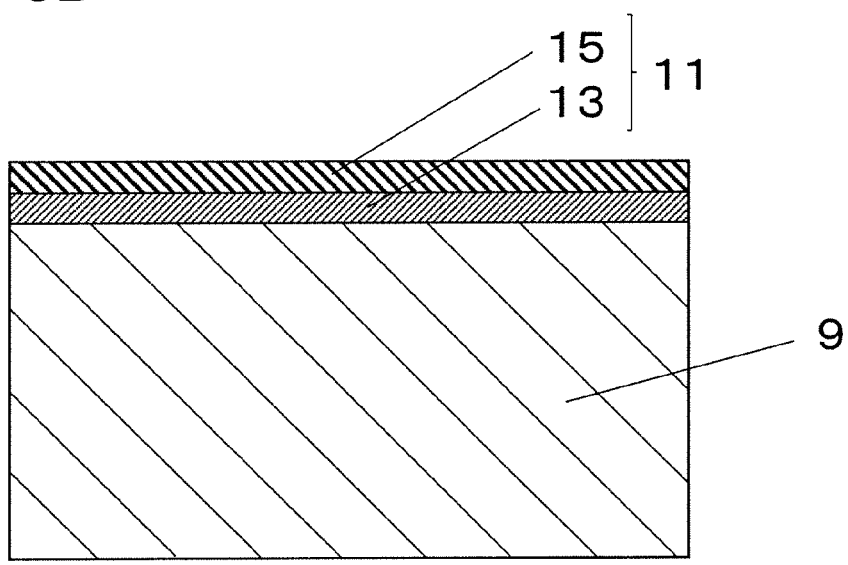
FIG. 3B is an enlarged view of a region B1 according to another embodiment, the region B1 illustrated in FIG. 2.

Further, as illustrated in FIG. 3B, the coated tool 1 according to the present disclosure may include, as the coating layer 11, an AlCrN layer 15 including an AlCrN crystal as the cubic crystal, in addition to the AlTiN layer 13. A plurality of the AlTiN layers 13 and a plurality of the AlCrN layers 15 may be respectively laminated. In this case, the plurality of AlTiN layers 13 and the plurality of AlCrN layers 15 may be laminated in a reverse order, or may be alternately laminated one upon another.

The AlCrN layer 15 may include only aluminum and chromium. Alternatively, the AlCrN layer 15 may include a metal component such as Si, Nb, Hf, V, Ta, Mo, Zr, Ti and W, in addition to aluminum and chromium. In this case, in the AlCrN layer 15, a total of the content ratios of aluminum and chromium is higher than a content ratio of the metal component. A content ratio of aluminum is settable to, for example, 20-60%. The content ratio of chromium is settable to, for example, 40-80%.

If the coated tool 1 includes the plurality of AlCrN layers 15, each of the AlCrN layers 15 may include the higher content ratio of aluminum than that of chromium, or alternatively, each of the plurality of AlCrN layers 15 may include the higher content ratio of chromium than that of aluminum.

Each of the AlCrN layers 15 may only include a metal component including aluminum and chromium. Alternatively, each of the AlCrN layers 15 may include nitride, carbide or carbonitride, each including one of, or both of, aluminum and chromium.

Compositions of the AlTiN layer 13 and the AlCrN layer 15 are measurable using, for example, energy dispersive X-ray spectroscopy (EDS) or X-ray photoelectron spectroscopy (XPS).

The number of the AlTiN layers 13 laminated and the number of the AlCrN layers 15 laminated are not limited to a specific value. The number of the AlTiN Layers 13 and the number of the AlCrN layers 15 may be set to, for example, 2 to 500.

If including the AlTiN layer 13, the coating layer 11 is increased in fracture resistance. If including the AlCrN layer 15, the coating layer 11 is increased in wear resistance. With a configuration where the plurality of AlTiN layers 13 and the plurality of AlCrN layers 15 are alternately located, the coating layer 11 is increased in entire strength.

Note that, the coating layer 11 is greater in entire strength if each of the plurality of AlTiN layers 13 and each of the plurality of AlCrN layers 15 are smaller in thickness and the number of the plurality of AlTiN layers 13 and the number of the plurality of AlCrN layers 15 are greater, compared with if each of the plurality of AlTiN layers 13 and each of the plurality of AlCrN layers 15 are greater in thickness and the number of the plurality of AlTiN layers 13 and the number of the plurality of AlCrN layers 15 are smaller.

The thickness of the AlTiN Layer 13 and the thickness of the AlCrN layer 15 are not limited to a specific value, but are individually settable to 5-100 nm. The thicknesses of the plurality of AlTiN layers 13 and the thicknesses of the plurality of AlCrN layers 15 may be constant or different from each other.

Note that, the coated tool 1 according to the present disclosure has the quadrangular plate shape as illustrated in FIG. 1, but the shape of the coated tool 1 is not limited thereto. Each of the first surface 3 and the third surface 8 does not have the quadrangular shape but may have, for example, a triangular shape, a hexagonal shape or a circular shape.

As illustrated in FIG. 1, the coated tool 1 according to the present disclosure may include, for example, a through hole 17. The through hole 17 is extended from the first surface 3 to the third surface 8 located on the opposite side of the first surface 3, and the through hole 17 opens into these surfaces. The through hole 17 is usable for attaching a screw or clamping member when holding the coated tool 1 onto a holder. There is no problem even if the through hole 17 opens into regions located on opposite sides in the second surface 5.

Examples of material of the base member 9 include inorganic materials, such as cemented carbide, cermet and ceramics. Examples of composition of cemented carbide include WC (tungsten carbide)-Co, WC—TiC (titanium carbide)-Co, and WC—TiC—TaC (tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride). The material of the base member 9 is not limited to these materials.

The coating layer 11 can be located on the base member 9 by using, for example, physical vapor deposition (PVD) method. In cases where the coating layer 11 is deposited with the base member 9 held on an inner peripheral surface of the through hole 17 by using the above vapor deposition method, the coating layer 11 can be located so as to cover the entirety of the surface of the base member 9 except for the inner peripheral surface of the through hole 17.

Examples of the physical deposition method includes ion plating method and sputtering method. As one embodiment of the deposition with the ion plating method, the coating layer 11 can be deposited with the following method.

In a first procedure, a metal target independently including aluminum and titanium, a composite alloy target or a sintered body target is prepared. The above target serving as a metal source is vaporized and ionized by an arc discharge or a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9. The AlTiN layer 13 is formable through the above procedure.

If the AlCrN layer 15 is included, in a second procedure, the metal target independently including aluminum and chromium, the composite alloy target or the sintered body target is prepared. The above target serving as a metal source is vaporized and ionized by an arc discharge or a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9 or the surface of the AlTiN layer 13. The AlCrN layer 15 is formable through the above procedure.

In the first and the second procedures described above, with a temperature of the base member set to 400 to 600° C. and pressure of the base member set to 2.0 to 4.0 Pa, a direct current bias voltage of −50 to −100V may be applied to the base member to have the arc discharge current set to 120-180 A.

The coating layer 11 having the configuration where the plurality of AlTiN layers 13 and the plurality of AlCrN layers 15 are alternately laminated one upon another is formable by alternately repeating the first procedure and the second procedure. The first procedure may be carried out after the second procedure. Also, the coating layer 11 may include only the AlTiN layer 13.

With the coated tool 1 according to the present disclosure, in order to form the AlTiN layer 13, the metal target independently including aluminum and titanium, the composite alloy target or the sintered body target may be adjusted in evaporation rate in the first procedure.

If the evaporation rate is reduced, the thickness of the AlTiN layer 13 deposited per hour on the surface of the base member 9 is reduced. If the evaporation rate is increased, the thickness of the AlTiN layer 13 deposited per hour on the surface of the base member 9 is increased.

If the thickness of the AlTiN layer 13 deposited per hour on the surface of the base member 9 is set to equal to or more than 5 μm and less than 20 μm, the AlTiN layer 13 includes the X-ray intensity at the first peak being 0.7 times or greater of the X-ray intensity at the second peak in the distribution of X-ray intensity indicated at a axis of the pole figure, the X-ray intensity regarding the (200) plane of the AlTiN crystal included in the AlTiN layer 13.

If the thickness of the AlTiN layer 13 deposited per hour on the surface of the base member 9 is set to equal to or more than 20 μm and less than 60 μm, the X-ray intensity at the first peak is 1.0 times or greater of the X-ray intensity at the second peak.

<Cutting Tool>

Next, a cutting tool according to the present disclosure will be described below with reference to the drawings.

Figure 7:
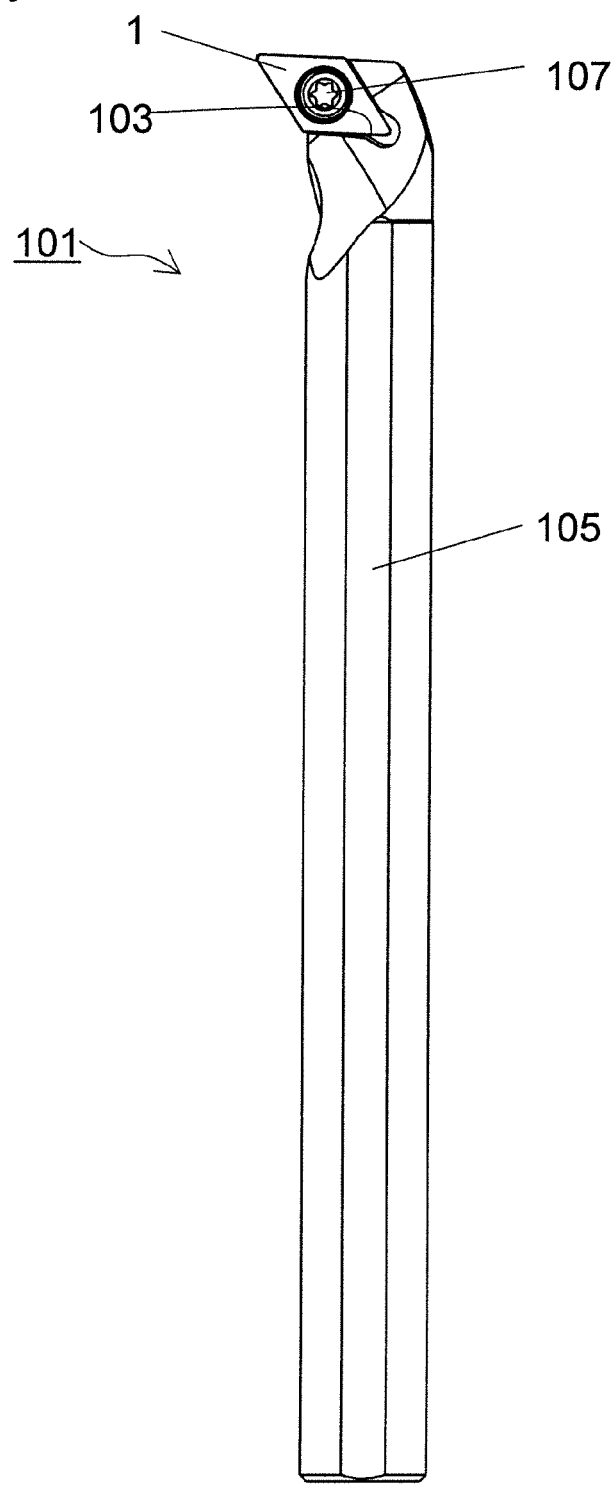
FIG. 7 is a plan view illustrating an example of a cutting tool according to the present disclosure.

As illustrated in FIG. 7, a cutting tool 101 according to the present disclosure is a bar-shaped body extended, for example, from a first end (an upper end in FIG. 7) toward a second end (a lower end in FIG. 7). As illustrated in FIG. 7, the cutting tool 101 includes a holder 105 with a pocket 103 located at a side of the first end (tip end), and the coated tool 1 located in the pocket 103. The cutting tool 101 including the coated tool 1 provides the cutting process stably for the long period of time.

The pocket 103 is a part that permits attachment of the coated tool 1. The pocket 103 includes a seating surface parallel to a lower surface of the holder 105, and a constraining side surface inclined relative to the seating surface. The pocket 103 opens into the side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached to the holder 105 so that at least a part of the ridge line where the first surface 3 intersects with the second surface 5, which is usable as the cutting edge 7, is protruded outward from the holder 105. The coated tool 1 is attached to the holder 105 by a fixing screw 107 in the embodiment. Specifically, the coated tool 1 is attachable to the holder 105 in such a manner that screw parts are engaged with each other by inserting the fixing screw 107 into the through hole 17 of the coated tool 1, and by inserting a front end of the fixing screw 107 into a screw hole (not illustrated) formed in the pocket 103.

Examples of material of the holder 105 include, for example, steel and cast iron. Of these materials, high toughness steel may be used.

The embodiment has illustrated and described the cutting tools for use in the so-called turning process. Examples of the turning process include inner diameter processing, outer diameter processing and grooving process. The cutting tools are not limited to ones which are used for the turning process. For example, the coated tools 1 of the above embodiments are applicable to the cutting tools for use in the milling process.

EXAMPLE

A coated tool according to the present disclosure will be described below.

Samples No. 1, No. 2 and No. 3 were prepared by varying a thickness of an AlTiN layer deposited per hour on a surface of a base member to 4 μm, 10 μm and 25 μm. The thickness of the AlTiN layer deposited per hour on the surface of the base member may be referred to as deposition speed. In each of the samples No. 1 to No. 3, a thickness of the AlTiN layer was set to 1.5 to 2.5 μm.

With the sample No. 2, the thickness of the AlTiN layer deposited per hour on the surface of the base member was set to 10 μm. With the sample No. 3, the thickness of the AlTiN layer deposited per hour on the surface of the base member was set to 25 μm. Then, in a distribution of X-ray intensity indicated at a axis of a pole figure, the X-ray intensity regarding a (200) plane of an AlTiN crystal as a cubic crystal included in the AlTiN layer of each of the sample No. 2 and the sample No. 3, the X-ray intensity at a first peak was 0.7 times or greater of the X-ray intensity at a second peak.

With the sample No. 3, the thickness of the AlTiN layer deposited per hour on the surface of the base member was set to 25 μm. Then, in the distribution of X-ray intensity indicated at a axis of the pole figure, the X-ray intensity regarding the (200) plane of the AlTiN crystal as the cubic crystal included in the AlTiN layer of the sample No. 3, the X-ray intensity at the first peak was 1.0 times or greater of the X-ray intensity at the second peak.

With the sample No. 1, the thickness of the AlTiN layer deposited per hour on the surface of the base member was set to 4 μm. Then, in a distribution of X-ray intensity indicated at a axis of a pole figure, the X-ray intensity regarding a (200) plane of an AlTiN crystal included in the AlTiN layer of the sample No. 1, the X-ray intensity at the first peak was less than 0.7 times of the X-ray intensity at the second peak.

Table 1 indicates a ratio (P1/P2) of the X-ray intensity at the first peak P1 to the X-ray intensity at the second peak P2 in the distribution of X-ray intensity indicated at a axis of the pole figure, the X-ray intensity regarding the (200) plane of the AlTiN crystal included in the AlTiN layer in each of the samples No. 1 to 3, together with hardness and a peeling load in each of the samples No. 1 to 3.

TABLE 1

| Sample No. | Intensity at a first peak P1 | Intensity at a second peak P2 | P1/P2 | Peeling load (/N) |
|---|---|---|---|---|
| 1 | 37625 | 55240 | 0.68 | 63.5 |
| 2 | 50905 | 52647 | 0.97 | 71.5 |
| 3 | 65086 | 61496 | 1.06 | 72.0 |

A measurement condition of the distribution of X-ray intensity was as follows. If a surface normal of the sample was on a plane determined by an incident line and a diffraction line, an α angle was set to be 90°. If the α angle was 90°, the α angle corresponded to a center point on the pole figure.

(1) Flat plate collimator
(2) Scanning method: concentric circle
(3) β scanning range: 0 to 360°/2.5° pitch
(4) θ fixed angle: a diffraction angle for the (200) plane of the AlTiN crystal was set to an angle in a range of 42.0° to 44.0°, the angle where a diffraction intensity was highest.
(5) α scanning range: 0 to 90°/2.5° step
(6) Target: CuKα; voltage: 45 kV; current: 40 mA The peeling load (load causing the peeling) was measured by a scratch testing device within a load range from 0 to 100 N.

In the distribution of X-ray intensity indicated at a axis of the pole figure, the X-ray intensity regarding the (200) plane of the AlTiN crystal included in the AlTiN layer, the X-ray intensity at the first peak was 0.7 times or greater of the X-ray intensity at the second peak in the sample No. 2, and the X-ray intensity at the first peak was 1.0 times or greater of the X-ray intensity at the second peak in the sample No. 3. Each of the samples No. 2 and No. 3 was greater in peeling load than the sample No. 1. Further, in the cutting process, each of the samples No. 2 and No. 3 had a longer period of time until the coating film was peeled off than the sample No. 1.

DESCRIPTION OF THE REFERENCE NUMERAL

1: Coated tool
3: First surface
3a: Rake surface region
5: Second surface
5a: Flank surface region
7: Cutting edge
8: Third surface
9: Base member
11: Coating layer
13: AlTiN layer
15: AlCrN layer
17: Through hole
101: Cutting tool
103: Pocket
105: Holder
107: Fixing screw

The invention claimed is:

1. A coated tool, comprising:
a base member; and
a coating layer located on the base member,
wherein
the coating layer comprises a cubic crystal that comprises one or more kinds of elements selected from Groups 4, 5 and 6 in the periodic table, Al, Si, B, Y and Mn, and one or more kinds of elements selected from C, N and O,
wherein the cubic crystal comprising the coating layer is oriented so that in a distribution of X-ray intensity indicated at a axis of a pole figure, the X-ray intensity regarding a (200) plane of the cubic crystal is characterized by
a first peak located in a range of 15° to 30°, a second peak located in a range of 60° to 75°, and a valley part between the first peak and the second peak, the valley part comprising the X-ray intensity smaller than the X-ray intensity at each of the first peak and the second peak, wherein the first peak, the second peak and the valley part are defined by X-ray intensity points on the pole figure at which a slope of the distribution is zero, and wherein the X-ray intensity at the first peak is 0.7 times or greater of the X-ray intensity at the second peak.

2. The coated tool according to claim 1, wherein the X-ray intensity at the first peak is 1.0 times or greater of the X-ray intensity at the second peak.

3. The coated tool according to claim 1, wherein the coating layer comprises an AlTiN layer comprising an AlTiN crystal as the cubic crystal.

4. The coated tool according to claim 1, wherein the coating layer comprises an AlCrN layer comprising an AlCrN crystal as the cubic crystal.

5. The coated tool according to claim 4, wherein the coating layer comprises a plurality of the AlTiN layers and a plurality of the AlCrN layers.

6. The coated tool according to claim 1, wherein the base member comprises each of tungsten carbide and cobalt.

7. A cutting tool, comprising:
a holder extending from a first end toward a second end and comprising a pocket located at a side of the first end; and
the coated tool according to claim 1, the coated tool being located in the pocket.

* * * * *